United States Patent
Emami et al.

(10) Patent No.: US 7,104,267 B2
(45) Date of Patent: *Sep. 12, 2006

(54) PLANARIZED COPPER CLEANING FOR REDUCED DEFECTS

(75) Inventors: Ramin Emami, San Jose, CA (US); Shijian Li, San Jose, CA (US); Sen-Hou Ko, Sunnyvale, CA (US); Fred C. Redeker, Fremont, CA (US); Madhavi Chandrachood, Sunnyvale, CA (US)

(73) Assignee: Applied Materials Inc., Santa Clara, CA (US)

( * ) Notice: Subject to any disclaimer, the term of this patent is extended or adjusted under 35 U.S.C. 154(b) by 572 days.

This patent is subject to a terminal disclaimer.

(21) Appl. No.: 09/727,133

(22) Filed: Nov. 29, 2000

(65) Prior Publication Data

US 2001/0015345 A1 Aug. 23, 2001

Related U.S. Application Data

(63) Continuation-in-part of application No. 09/450,479, filed on Nov. 29, 1999.

(51) Int. Cl.
*H01L 21/302* (2006.01)

(52) U.S. Cl. .................. 134/1.3; 438/692; 438/747; 438/749; 438/750; 438/754

(58) Field of Classification Search ............... 134/1.3; 438/692, 693, 747, 749, 750, 754; 216/88; 89/89; 90/90; 100/100; 105/105

See application file for complete search history.

(56) References Cited

U.S. PATENT DOCUMENTS

| 659,282 | A | * | 10/1900 | Berry ................... 132/290 |
| 4,169,337 | A | | 10/1979 | Payne ................ 51/283 R |
| 4,588,421 | A | | 5/1986 | Payne ................... 51/308 |
| 4,752,628 | A | | 6/1988 | Payne ................... 523/122 |

(Continued)

FOREIGN PATENT DOCUMENTS

| EP | 0 620 293 A | 10/1994 |
| EP | 0 859 407 A | 8/1998 |
| EP | 0 913 442 A2 | 5/1999 |

(Continued)

OTHER PUBLICATIONS

Brusic, V. et al, "Copper Corrosion With and Without Inhibitors", *Electrochem. Soc.*, 138:8, 2253–2259, Aug. 1991.
EPO Search Report, for EP No. 00310488.2, dated Apr. 18, 2001.
U.S. Patent Application for 09/163,582, filed on Sep. 30, 1998 (AMAT/2720) US 20010052351.

(Continued)

*Primary Examiner*—George A. Goudreau
(74) *Attorney, Agent, or Firm*—Patterson & Sheridan

(57) ABSTRACT

A process for treating a copper or copper alloy substrate surface with a composition and corrosion inhibitor solution to minimize defect formation and surface corrosion, the method including applying a composition including one or more chelating agents, a pH adjusting agent to produce a pH between about 3 and about 11, and deionized water, and then applying a corrosion inhibitor solution. The composition may further comprise a reducing agent and/or corrosion inhibitor. The method may further comprise applying the corrosion inhibitor solution prior to treating the substrate surface with the composition.

54 Claims, 2 Drawing Sheets

U.S. PATENT DOCUMENTS

| | | |
|---|---|---|
| 4,867,757 A | 9/1989 | Payne .................. 51/293 |
| 5,264,010 A | 11/1993 | Brancaleoni et al. ......... 51/308 |
| 5,614,444 A | 3/1997 | Farkas et al. ............... 437/225 |
| 5,662,769 A | 9/1997 | Schonauer et al. |
| 5,700,383 A | 12/1997 | Feller et al. .................. 216/88 |
| 5,738,574 A | 4/1998 | Tolles et al. ................. 451/288 |
| 5,738,800 A | 4/1998 | Hosali et al. ................. 216/99 |
| 5,756,398 A | 5/1998 | Wang et al. ................. 438/692 |
| 5,769,689 A | 6/1998 | Cossaboon et al. ........... 451/41 |
| 5,840,629 A | 11/1998 | Carpio ....................... 438/692 |
| 5,876,508 A | 3/1999 | Wu et al. ....................... 134/2 |
| 5,911,835 A | 6/1999 | Lee et al. .................... 134/1.3 |
| 5,932,486 A | 8/1999 | Cook et al. ................. 438/692 |
| 5,958,794 A | 9/1999 | Bruxvoort et al. |
| 5,981,454 A | 11/1999 | Small |
| 6,033,993 A | 3/2000 | Love, Jr. et al. |
| 6,042,741 A | 3/2000 | Hosali et al. |
| 6,046,110 A | 4/2000 | Hirabayashi et al. |
| 6,054,379 A | 4/2000 | Yau et al. |
| 6,063,306 A | 5/2000 | Kaufman et al. |
| 6,068,879 A | 5/2000 | Pasch |
| 6,074,949 A | 6/2000 | Schonauer et al. |
| 6,077,337 A | 6/2000 | Lee |
| 6,083,840 A | 7/2000 | Mravic et al. |
| 6,096,652 A | 8/2000 | Watts et al. |
| 6,117,775 A | 9/2000 | Kondo et al. |
| 6,117,783 A | 9/2000 | Small et al. |
| 6,123,088 A | 9/2000 | Ho |
| 6,156,661 A | 12/2000 | Small |
| 6,274,059 B1 * | 8/2001 | Krusell et al. ................. 216/88 |
| 6,348,725 B1 * | 2/2002 | Cheung et al. ............. 257/642 |
| 6,355,075 B1 | 3/2002 | Ina et al. |
| 6,355,153 B1 | 3/2002 | Uzoh et al. |
| 6,432,826 B1 * | 8/2002 | Emami et al. .............. 438/692 |
| 6,436,302 B1 * | 8/2002 | Li et al. ......................... 216/38 |
| 6,451,697 B1 * | 9/2002 | Sun et al. .................... 438/691 |
| 6,524,167 B1 * | 2/2003 | Tsai et al. ...................... 451/41 |
| 6,541,697 B1 | 4/2003 | Georg et al. |
| 6,569,349 B1 * | 5/2003 | Wang et al. ................ 252/79.1 |
| 6,572,453 B1 * | 6/2003 | Wijekoon et al. .............. 451/56 |
| 6,593,239 B1 | 7/2003 | Kaufman et al. |
| 6,593,282 B1 | 7/2003 | Li et al. |
| 6,653,242 B1 * | 11/2003 | Sun et al. .................... 438/738 |
| 6,656,842 B1 * | 12/2003 | Li et al. ...................... 438/691 |
| 6,709,316 B1 * | 3/2004 | Sun et al. ...................... 451/41 |
| 6,736,952 B1 | 5/2004 | Emesh et al. |
| 2001/0004538 A1 * | 6/2001 | Li et al. ...................... 438/691 |
| 2001/0052351 A1 * | 12/2001 | Brown et al. .................. 134/2 |
| 2002/0148169 A1 * | 10/2002 | Emami et al. ................ 51/309 |
| 2002/0160698 A1 | 10/2002 | Sato et al. |
| 2003/0022901 A1 * | 1/2003 | Childers et al. ........ 514/253.11 |
| 2003/0114004 A1 | 6/2003 | Sato et al. |

FOREIGN PATENT DOCUMENTS

| | | |
|---|---|---|
| FR | 2722511 | 1/1996 |
| WO | 93/10277 | 5/1993 |
| WO | WO 98/49723 | 11/1998 |
| WO | WO 99/46353 | 9/1999 |
| WO | WO 00/30159 | 5/2000 |
| WO | WO 00/36037 | 6/2000 |
| WO | WO 00/49647 | 8/2000 |
| WO | WO 00/53691 | 9/2000 |
| WO | 00/59029 | 10/2000 |

OTHER PUBLICATIONS

U.S. Patent Application for 09/359,141, filed on Jul. 21, 1999 (AMAT/2720.P1) US 6,572,453.

U.S. Patent Application for 09/569,968, filed on May 11, 2000 (AMAT/4534) US 20030022801.

U.S. Patent Application for 09/543,777, filed Apr. 5, 2000 (AMAT/4161) US 20020148169.

U.S. Patent Application for 09/606,544, filed Jun. 30, 2000 (AMAT/4048) (abandoned).

U.S. Patent Application for 09/469,709, filed Dec. 21, 1999 (AMAT/3786) US 20010004538.

* cited by examiner

PLANARIZED COPPER CLEANING FOR REDUCED DEFECTS

RELATED APPLICATIONS

This application is a continuation-in-part of co-pending U.S. patent application Ser. No. 09/450,479 [AMAT/3976], which was filed on Nov. 29, 1999, and is incorporated by reference herein.

BACKGROUND OF THE INVENTION

1. Field of the Invention

The present invention relates to copper (Cu) and/or copper alloy metallization in semiconductor devices with improved planarity and reduced defects. The present invention is applicable to manufacturing high speed integrated circuits having submicron design features and high conductivity interconnect structures with improved reliability.

2. Background of the Related Art

The escalating requirements for high density and performance associated with ultra large scale integration semiconductor wiring require responsive changes in interconnect technology. Such escalating requirements have been found difficult to satisfy in terms of providing a low RC (resistance and capacitance) interconnect pattern, particularly in applications where submicron vias, contacts and trenches have high aspect ratios imposed by miniaturization.

Conventional semiconductor devices comprise a semiconductor substrate, typically doped monocrystalline silicon, and a plurality of sequentially formed dielectric interlayers and conductive patterns. An integrated circuit is formed containing a plurality of conductive patterns comprising conductive lines separated by interwiring spacings, and a plurality of interconnect lines. Typically, the conductive patterns on different layers, i.e,. are electrically connected by a conductive plug filling a via hole, while a conductive plug filling a contact hole establishes electrical contact with an active region on a semiconductor substrate, such as a source/drain region. Conductive lines are formed in trenches which typically extend substantially horizontal with respect to the semiconductor substrate. Semiconductor "chips" comprising five or more levels of metallization are becoming more prevalent as device geometries shrink to submicron levels.

A conductive plug filling a via hole is typically formed by depositing an dielectric layer on a conductive layer comprising at least one conductive pattern, forming an opening through the dielectric layer by conventional photolithographic and etching techniques, and filling the opening with a conductive material, such as tungsten (W). Excess conductive material on the surface of the dielectric interlayer is typically removed by chemical mechanical polishing (CMP). One such method is known as damascene and basically involves forming an opening in the dielectric interlayer and filling the opening with a metal. Dual damascene techniques involve forming an opening comprising a lower contact or via hole section in communication with an upper trench section. The entire opening is filled with a conductive material, typically a metal, to simultaneously form a conductive plug in electrical contact with a conductive line.

Copper (Cu) and copper alloys have received considerable attention as candidates for replacing aluminum (Al) in interconnect metallization. Copper and copper alloys are relatively inexpensive, easy to process, and have a lower resistivity than aluminum. In addition, copper and copper alloys have improved electrical properties, vis-à-vis tungsten (W), making copper and copper alloys desirable metals for use as a conductive plug as well as conductive wiring.

An approach to forming copper and copper alloy plugs and wiring comprises the use of damascene structures. However, due to copper diffusion through dielectric layer materials, such as silicon dioxide, a diffusion barrier layer for copper interconnect structures is provided between copper or copper alloy interconnect structures and surrounding dielectric materials. Typical diffusion barrier metals include tantalum (Ta), tantalum nitride (TaN), titanium nitride (TiN), titanium-tungsten (TiW), tungsten (W), tungsten nitride (WN), titanium-titanium nitride (Ti—TiN), titanium silicon nitride (TiSiN), tungsten silicon nitride (WSiN), tantalum silicon nitride (TaSiN) and silicon nitride for copper and copper alloys. The use of such barrier materials to encapsulate copper is not limited to the interface between copper and the dielectric interlayer, but includes interfaces with other metals as well.

In conventional CMP techniques, a wafer carrier assembly is rotated in contact with a polishing pad in a CMP apparatus. The polishing pad is mounted on a rotating turntable or platen, or moving above a stationary polishing table, driven by an external driving force. The wafers are typically mounted on a carrier which provides a controllable pressure urging the wafers against the polishing pad. Thus, the CMP apparatus effects polishing or rubbing movement between the surface of each thin semiconductor wafer and the polishing pad while dispersing a polishing chemical with or without abrasive particles in a reactive solution to effect both chemical activity and mechanical activity while applying a force between the wafer and a polishing pad.

It is extremely difficult to planarize a copper or copper alloy surface, as by CMP of a damascene inlay, without generating a high degree of surface defects, such as corrosion, scratches, pitting and embedded abrasive particles. A dense array of copper or copper alloy features is typically formed in a dielectric layer, such as a silicon oxide layer, by a damascene technique wherein trenches are initially formed. A barrier layer, such as a tantalum-containing layer, e.g., tantalum (Ta), or tantalum nitride (TaN), is then conformally deposited on the exposed surfaces of the trenches and on the upper surface of the dielectric layer. Copper or a copper alloy is then deposited, as by electroplating, electroless plating, physical vapor deposition (PVD) or chemical vapor deposition (CVD) on the barrier layer, typically at a thickness between about 8,000 Å and about 18,000 Å.

CMP is then conducted to remove the copper or copper alloy overburden stopping on the barrier layer followed by barrier layer removal, employing a mixture of a chemical agent and abrasive particles, to remove the barrier layer, or conducting CMP directly down to the dielectric layer. Copper or copper alloy overburden is material deposited on the substrate in excess of the required amount to fill features formed on the substrate surface. Buffing is optionally conducted on the dielectric layer surface to remove defects, such as scratches in the dielectric materials and further planarize the dielectric material, leaving a copper or the copper alloy filling the damascene opening. The resulting copper or copper alloy filling the dual damascene has an exposed upper surface typically having a high concentration of surface defects. These defects include corrosion, e.g., corrosion stains, microscratches, micropitting and surface abrasive particles. Copper and copper alloy wafers exhibit a much greater tendency to scratch during planarization than dielectric materials, such as oxides or nitrides. Copper and copper alloy surfaces corrode very easily and are difficult to passivate in low pH aqueous environments. Conventional wafer cleaning alone cannot completely eliminate such defects. Conventional practices for planarizing copper or copper alloys disadvantageously result in a high defect count subsequent to planarization. Such surface defects adversely impact device performance and reliability, particularly as device geometries shrink into the deep sub-micron range. Therefore, there exists a need for methodology enabling the planarization of copper and copper alloys with a reduced amount of surface defects. There exists a further need for such enabling methodology that is compatible with conventional polishing techniques and apparatus.

SUMMARY OF THE INVENTION

Aspects of the invention generally provide a method and composition for planarizing a substrate surface including planarizing metals, such as copper and copper alloys, with reduced surface defects and surface corrosion.

In one aspect, the invention provides a method of treating a substrate surface comprising copper or a copper alloy, the method comprising applying to the substrate surface a composition comprising one or more chelating agents, a pH adjusting agent to produce a pH between about 3 and about 11, and deionized water, and then applying a corrosion inhibitor solution. The method may use a composition further including a corrosion inhibitor and/or a reducing agent. The method may further comprise treating the substrate surface with the corrosion inhibitor solution prior to treating the substrate surface with the composition.

In another aspect, the invention provides a method for planarizing a substrate surface containing a dielectric layer having an upper surface and at least one opening, a barrier layer lining the opening and on the upper surface of the dielectric layer, and copper or a copper alloy filling the opening and the dielectric layer, the method comprising removing the copper or copper alloy layer and the barrier leaving an exposed substrate surface comprising copper or copper alloy, and treating the exposed substrate surface comprising copper or the copper alloy by applying thereto a composition comprising one or more chelating agents, a pH adjusting agent to produce a pH between about 3 and about 11, and deionized water, and then applying a corrosion inhibitor solution. The composition may further include a corrosion inhibitor and/or a pH adjusting agent. The method may further comprise removal of the barrier layer removal after removing the copper or copper alloy layer and prior to chemically treating the exposed substrate surface. The method may further comprise treating the substrate surface with the corrosion inhibitor solution prior to applying the composition.

DETAILED DESCRIPTION OF THE PREFERRED EMBODIMENT

Figure 1:
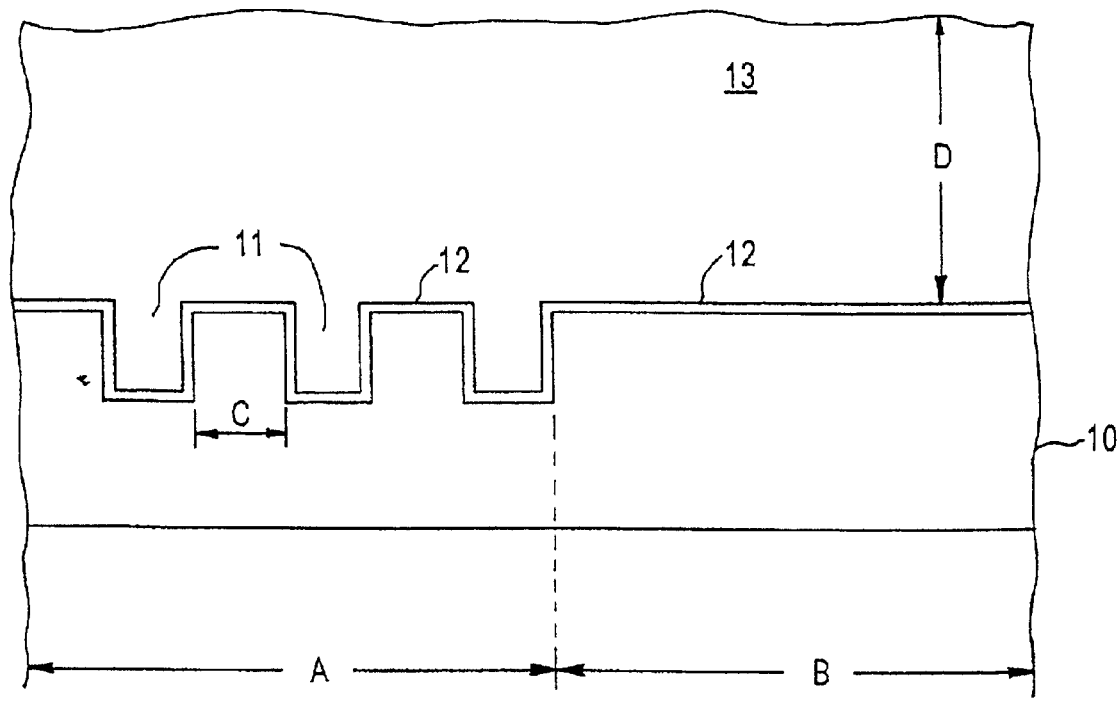
FIGS. 1–4 illustrate processing step of a method in accordance with an embodiment of the present invention.

Embodiments of the present invention described herein enable effective and efficient planarization of a substrate surface having copper or copper alloy containing features with significantly reduced defects, such as corrosion, scratches, pitting and embedded abrasive particles, consistent with the ever increasing demands for reliable interconnect patterns having feature sizes in the deep submicron range. As used throughout this disclosure, copper or copper alloy is intended to encompass high purity elemental copper as well as copper-based alloys, e.g., copper-based alloys containing at least about 80 wt. % copper.

Embodiments of the invention described herein can be advantageously used in a strategic multi-step process subsequent to CMP and barrier layer removal. The multi-step methodology of embodiments of the invention treat the surface of the substrate generated during CMP copper or copper alloy layer and barrier layer removal leaving a substrate surface with reduced surface defects and passivated from oxidation and other processes that can cause the formation of defects in the substrate surface following CMP processing. The treatment of the substrate surface can comprise removing a thin surface layer of the processed substrate, such as copper or copper alloy containing features formed in the substrate surface, and/or removing corrosion stains, typically copper oxide and/or copper hydroxide mixed with corrosion by-products.

The multi-step methodology of embodiments of the invention comprise treating the exposed substrate surface of copper or copper alloy containing features after barrier layer removal including applying an optional corrosion inhibitor solution, a composition including one or more chelating agents, such as an acid, e.g., citric acid, and/or a base, e.g., ammonium hydroxide and/or an amine, one or more pH adjusting agents to produce a pH between about 3 and about 11, and deionized water, and then applying a corrosion inhibitor solution. The composition may further include a corrosion inhibitor and/or a reducing agent.

The exact mechanism underpinning the reduction of defects and surface passivation achieved by embodiments of the invention is not known with certainty. However, it is believed that the treatment in accordance with embodiments of the invention subsequent to barrier layer removal removes a thin layer of the surface of the copper or copper alloy containing features containing defects and/or removes corrosion stains leaving a relatively defect free surface, and promptly passivates the relatively defect free surface to avoid the generation of further defects. It is believed that the optional initial treatment with a corrosion inhibitor and deionized water reduces corrosion, particularly corrosion induced by an abrasive slurry used on the surface of the copper or copper alloy containing features. Corrosion, unlike static etching, is non-uniform and, hence, should be avoided.

The optional initial treatment with a corrosion inhibitor solution can comprise the use of any of various corrosion inhibitors, such as benzotriazole (BTA) or 5-methyl-1-benzotriazole (TTA) present in an amount between about 0.01 wt. % and about 0.50 wt. % corrosion inhibitor and deionized water. In one aspect, the corrosion inhibitor solution includes about 0.05 wt. % corrosion inhibitor and deionized water. The initial treatment comprises exposing the surface of the substrate for between about 3 seconds and about 10 seconds, e.g. In one aspect of the process, the corrosion inhibitor solution is applied for about 5 seconds.

The substrate surface is treated with a composition treating the exposed surface comprising copper or the copper alloy by applying thereto a composition including one or more chelating agents, a pH adjusting agent to produce a pH between about 3 and about 11, and deionized water, and then applying a corrosion inhibitor solution. The composition may further comprise a corrosion inhibitor and/or a reducing agent. In one aspect of the invention, the composition may be diluted between a saturated composition to a very dilute solution of about 1 vol % of the composition. In one aspect, the composition is diluted with deionized water between about 5 vol % and about 10 vol % of the original composition.

It is believed that a subsequent treatment with the composition effects removal of up to about 50 Å of the surface of the features disposed in the substrate surface and/or corrosion stains, generated by surface corrosion, microscratching and pitting, leaving a substantially defect free surface. This surface treatment can be conducted by application of the composition between about 10 seconds and about 20 seconds.

The one or more chelating agents may include an acid, a base, or a combination thereof. The acid may include an organic acid, such as a carboxylic acid having one or more acid groups. Examples of acids suitable for use in the composition include acetic acid, citric acid, maleic acid, and combinations thereof. The acid can be present in an amount up to about 40 wt. % of the composition. In one aspect of the composition, the acid comprises between about 5 wt. % and about 30 wt. % of the composition. The acid may also perform as a chelating agent in the composition, for example, acetic acid may perform as a chelating agent for copper or copper alloys. When a diluted solution of the composition is used for cleaning the substrate surface, the acid preferably has a concentration between about 2 wt. % and about 10 wt. % of the diluted composition.

The base may include ammonium hydroxide, ammonium hydroxide derivatives, amines, and combinations thereof. Examples of amines include primary amines, such as methylamine and ethylamine, secondary amines, and combinations thereof. The base may include compounds having one or more amine groups or amide groups, such as ethylenediaminetetraacetic acid, methylformamide, or ethylenediamine. An example of an ammonium hydroxide derivative is tetramethyl ammonia hydroxide. The base can be present in an amount up to about 5 wt. % of the composition. In one aspect, the base includes between about 0.5 wt. % and about 3.0 wt. % of the composition. The base may also perform as a chelating agent in the composition, for example, ammonium hydroxide may perform as a chelating agent for copper or copper alloys. Generally, acids and bases that may perform as chelating agents chemically react with material, such as metal ions, from the surface of the substrate or in the composition to form a soluble metal complex for removal from the surface of the substrate.

The one or more pH adjusting agents may include non-oxidizing organic and inorganic acids or bases. The pH adjusting agent is generally in an amount sufficient to generate or maintain a desired pH between about 3 and about 11, such as an acidic pH, for example a pH of about 3, or a neutral pH, e.g., a pH between about 6 and about 8. In one aspect, the composition has a pH between about 3 and about 7. Examples of pH adjusting agents include bases such as potassium hydroxide (KOH), and/or inorganic and/or organic acids, such as acetic acid, phosphoric acid, or oxalic acid.

An acidic pH adjusting agent may be used with a basic chelating agent; a basic pH adjusting agent may be used with an acidic chelating agent; and both acidic and basic pH adjusting agents may be used with a combination of acidic and basic chelating agents. The one or more pH adjusting agents may include acidic chelating agents, basic chelating agents, or a combination thereof in the composition.

Corrosion inhibitors, such as any various organic compounds containing an azole group, including benzotriazole (BTA), mercaptobenzotriazole, or 5-methyl-1-benzotriazole (TTA), can be added to the composition in a amount between about 0.01 wt. % and about 0.50 wt. % of the composition. In one aspect, the corrosion inhibitor comprises about 0.05 wt. % of the composition.

Additionally, a reducing agent may be added to the composition to enhance removal of surface defects. The reducing agent can be selected from the group of hydroxylamine, glucose, sulfothionate, potassium iodide, and combinations thereof. The reducing agent can be present in an amount between about 0.01 wt. % to about 20 wt. % of the composition. In one aspect, the reducing agent comprises between about 0.01 wt. % to about 5 wt. % of the composition. In one aspect of the invention, a concentration of about 0.1 wt. % of reducing agent is used in the composition.

The corrosion inhibitor solution is then applied to the substrate surface. It is believed that the final treatment with the corrosion inhibitor solution described herein, such as TTA in deionized water, protects the surface during de-chucking and provides a passivated surface layer protecting the substantially defect-free surface of the copper or copper alloy containing features and substrate surface from attack by dissolved oxygen.

Embodiments of the invention described herein include removing the copper or copper alloy overburden and barrier layer in any of various conventional manners. For example, the copper or copper alloy overburden and barrier layer can be removed during a single stage CMP technique, or the copper or copper alloy overburden can be initially removed by CMP followed by removing the barrier layer. In either case, the substrate surface including the exposed surface of the copper or copper alloy containing features can be subjected to an additional buffing step to remove defects prior to performing the multi-step procedure of embodiments of the invention. Buffing is broadly defined herein as a contacting a substrate with a polishing pad and a chemical composition or de-ionized water with low or minimal pressure between the polishing pad and the substrate to remove surface defects and particulate matter from the substrate surface. Buffing is typically performed with a soft polishing in the absence of abrasive materials. CMP of the copper or copper alloy layer and barrier layer removal can be implemented in a conventional manner.

Conventional substrates and dielectric layers are encompassed by embodiments of the invention. For example, the substrate can be doped monocrystalline silicon or gallium-arsenide. The dielectric layer can comprise any of various dielectric materials conventionally employed in the manufacture of semiconductor devices. For example, dielectric materials, such as silicon dioxide, phosphorus-doped silicon glass (PSG), boron-and phosphorous-doped silicon glass (BPSG) and silicon dioxide derived from tetraethyl orthosilicate (TEOS) or silane by plasma enhanced chemical vapor deposition (PECVD) can be employed. Dielectric layers in accordance with embodiments of the invention can also comprise low dielectric constant materials, including polymers, such as polyimides, and carbon-containing silicon dioxide, e.g., Black Diamond™ dielectric material available from Applied Materials, Inc., located in Santa Clara, Calif. The openings are formed in dielectric layers by conventional photolithographic and etching techniques.

An embodiment of the invention is schematically illustrated in FIGS. 1–4, wherein similar features bear similar reference numerals. Referring to FIG. 1, dielectric layer 10, e.g., silicon oxide, is formed overlying a substrate (not shown). A plurality of openings 11 are formed in a designated area A in which a dense array of conductive lines are to be formed bordering an open field B. A barrier layer 12, e.g., TaN, is deposited lining the openings 11 and on the upper surface of silicon oxide dielectric layer 10. Typically, the openings 11 are spaced apart by a distance C which is less than about 1 micron, e.g., about 0.2 micron. Copper layer 13 is then deposited at a thickness D between about 8,000 Å and about 18,000 Å.

Figure 2:
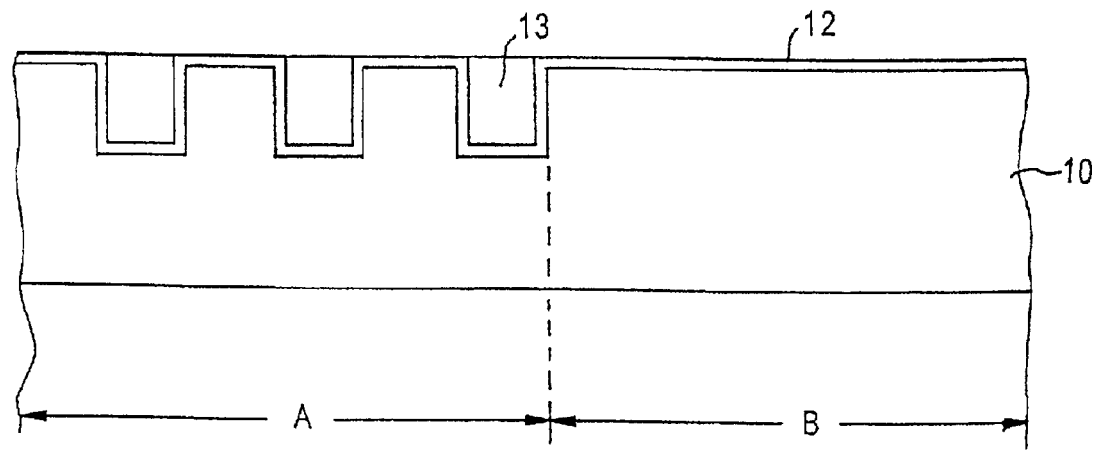
Figure 3:
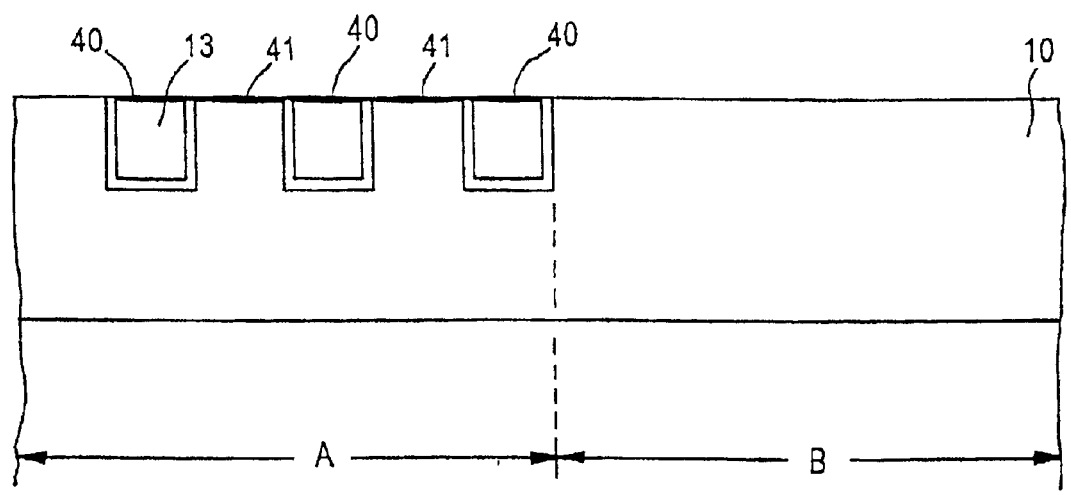

Referring to FIGS. 1 and 2, CMP is initially conducted in a conventional manner to remove the copper overburden stopping on TaN barrier layer 12. As shown in FIGS. 2 and 3, barrier layer removal is conducted in a conventional manner to remove TaN layer 12. The resulting copper interconnection structure comprises a dense array A of copper lines 13 bordered by open field B. However, the upper surface 40 of the copper containing feature and the dielectric surface 41 exhibit an unacceptably high defect count, e.g., measured at best of at least 750 defects, comprising primarily corrosion stains, microscratches, micropits and abrasive slurry particles.

In accordance with one embodiment of the invention described herein, the copper containing feature surface 40 and dielectric surface 41 are treated by a multi-step procedure comprising applying an optimal solution of a corrosion inhibitor, followed by a composition comprising one or more chelating agents, a pH adjusting agent to produce a pH between about 3 and about 11, and deionized water, and then applying a solution of a corrosion inhibitor. The optional initial treatment with a corrosion inhibitor solution can comprise deionized water and between about 0.01 and about 0.50 wt. %, e.g., about 0.05 wt. %, of a corrosion inhibitor, such as BTA or TTA. In one aspect, the corrosion inhibitor solution comprises about 0.05 wt. % corrosion inhibitor and deionized water. The optional initial treatment is performed for a period between about 3 and about 10 seconds, e.g., about 5 seconds.

The composition is then applied to the substrate to treat the substrate surface. The composition, for example, may comprise up to about 40 wt. % of an acid, e.g., between about 5 and about 30 wt. % citric acid, up to about 5 wt. % of ammonium hydroxide, ammonium hydroxide derivatives, amines, and combinations thereof, e.g., between about 0.5 and about 3.0 wt. % ammonium hydroxide, the remainder deionized water. The composition has a pH between about 4 and about 5.

One embodiment of the composition described herein that has been observed to produce effective results includes about 26 wt. % citric acid, about 3 wt. % ammonia, deionized water, and has a pH of about 4.

The composition is applied to the substrate surface for a suitable period of time, e.g., between about 10 seconds and about 30 seconds.

Figure 4:
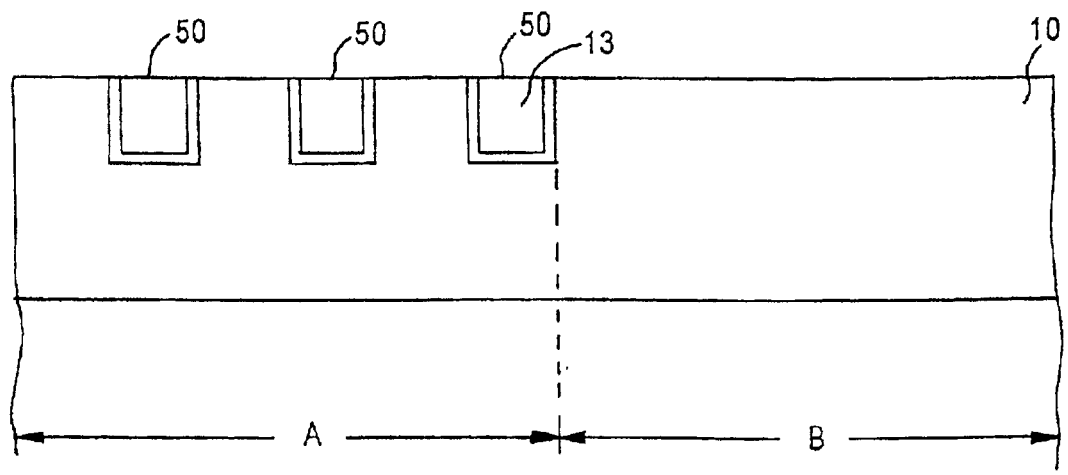

Subsequently, the substrate is de-chucked while applying thereto a corrosion inhibitor, such as TTA or BTA in deionized water. The treatment with an optional corrosion inhibitor, followed by cleaning with the composition described herein, and de-chucking with a corrosion inhibitor, effectively removes a defective upper surface of the copper or copper alloy containing feature 40 and dielectric surface 41 leaving a relatively defect-free passivated surface 50, as shown in FIG. 4. Experiments conducted employing the inventive procedure resulted in a planarized substrate surface having copper or copper alloy containing features having a surface with a defect count less than 139, even less than 100, as measured.

Embodiments of the invention described herein are applicable to planarizing a substrate surface during various stages of semiconductor manufacturing employing any of various types of CMP systems. Embodiments of the invention described herein enjoy particular applicability in the manufacture of high density semiconductor devices with metal features in the deep submicron range.

While foregoing is directed to the preferred embodiment of the invention, other and further embodiments of the invention may be devised without departing from the basic scope thereof, and the scope thereof is determined by the claims that follow.

What is claimed is:

1. A method of treating a substrate surface comprising copper or a copper alloy, the method comprising:
    applying to the substrate surface a composition comprising:
        one or more chelating agents, wherein the one or more chelating agents comprise an acid and a base;
        one or more pH adjusting agents to produce a pH between about 3 and about 11;
        deionized water; and
        a reducing agent, wherein the reducing agent comprises between about 0.01 wt. % and about 20 wt. % of the composition; and then applying a corrosion inhibitor solution.

2. The method according to claim 1, further comprising treating the substrate surface with the corrosion inhibitor solution prior to the applying to the substrate surface the composition.

3. The method according to claim 2, wherein the corrosion inhibitor solution comprises between about 0.01 wt. % and about 0.50 wt. % corrosion inhibitor and deionized water.

4. The method according to claim 3, wherein the corrosion inhibitor is selected from the group consisting of benzotriazole, 5-methyl-1-benzotriazole, and combinations thereof.

5. The method according to claim 1, wherein the one or more chelating agents comprising an acid and a base has an acid concentration of up to about 40 wt. % of the composition.

6. The method according to claim 5, wherein the acid is a carboxylic acid having one or more acid groups.

7. The method according to claim 6, wherein the acid is selected from the group consisting of acetic acid, citric acid, maleic acid, and combinations thereof.

8. The method according to claim 1, wherein the one or more chelating agents comprising an acid and a base has a base concentration up to about 5 wt. % of the composition.

9. The method according to claim 1, wherein the base comprises between about 0.5 wt. % and about 3 wt. % of the composition.

10. The method according to claim 8, wherein the base is selected from the group consisting of ammonium hydroxide, ammonium hydroxide derivatives, amines, and combinations thereof.

11. The method according to claim 1, wherein the composition further comprises a corrosion inhibitor.

12. The method according to claim 11, wherein the corrosion inhibitor in the composition comprises between about 0.01 wt. % and about 0.50 wt. % of the composition.

13. The method according to claim 11, wherein the corrosion inhibitor in the composition is selected from the group consisting of benzotriazole, 5-methyl-1-benzotriazole, and combinations thereof.

14. The method according to claim 1, wherein the composition has a pH between about 4 and about 5 and comprises between about 5 wt. % and about 30 wt. % citric acid, and between about 0.5 wt. % and about 3.0 wt. % ammonium hydroxide.

15. The method according to claim 2, wherein the treating the substrate surface with the corrosion inhibitor solution lasts about 3 and about 10 seconds.

16. The method according to claim 1, wherein the composition is applied between about 10 and about 20 seconds.

17. A method of treating a substrate surface comprising copper or a copper alloy, the method comprising:
   applying to the substrate surface a composition comprising:
      one or more chelating agents, wherein the one or more chelating agents comprise an acid and a base;
      one or more pH adjusting agents to produce a pH between about 3 and about 11 ;
      a reducing agent wherein the reducing agent is selected from the group consisting of hydroxylamine, glucose, sulfothionate, potassium iodide, and combinations thereof; and
      deionized water; and then applying a corrosion inhibitor solution.

18. The method according to claim 17, wherein the corrosion inhibitor solution comprises between about 0.01 wt. % and about 0.50 wt. % corrosion inhibitor and deionized water.

19. The method according to claim 18, wherein the corrosion inhibitor is selected from the group consisting of benzotriazole, 5-methyl-1-benzotriazole, and combinations thereof.

20. The method according to claim 18, wherein the corrosion inhibitor solution is applied between about 3 and about 10 seconds.

21. The method according to claim 1, wherein the one or more pH adjusting agents are selected from the group consisting of a non-oxidizing inorganic acid, a non-oxidizing organic acid, a non-oxidizing inorganic base, a non-oxidizing organic base, and combinations thereof.

22. The method according to claim 1, wherein the one or more pH adjusting agents comprise an acidic chelating agent, a basic chelating agent or a combination thereof.

23. A method of planarizing a substrate surface containing an dielectric layer having an upper surface and at least one opening, a barrier layer lining the opening and the upper surface of the dielectric layer, and copper or a copper alloy filling the opening and on the dielectric layer, the method comprising:
   removing the copper or copper alloy layer and the barrier leaving an exposed substrate surface comprising copper or copper alloy in the opening; and
   treating the exposed substrate surface comprising copper or the copper alloy by applying thereto a composition comprising
      one or more chelating agents,
      one or more pH adjusting agents to produce a pH between about 3 and about 11, and
      deionized water, wherein the one or more chelating agents comprise an acid and a base and wherein the composition further comprises a reducing agent, wherein the reducing agent comprises between about 0.01 wt.% and about 20 wt% of the composition; and then
   applying a corrosion inhibitor solution.

24. The method according to claim 23, further comprising removing the barrier layer after removing the copper or copper alloy layer and prior to chemically treating the exposed substrate surface.

25. The method according to claim 23, wherein removing the copper or the copper alloy layer comprises chemical-mechanical polishing (CMP) the copper or the copper alloy layer.

26. The method according to claim 25, wherein the method comprises:
   removing the copper or copper alloy layer and stopping on the barrier layer;
   removing the barrier layer and leaving the exposed substrate surface comprising copper or copper alloy features.

27. The method according to claim 23, wherein:
   the dielectric layer comprises a silicon oxide; and
   the barrier layer comprises tantalum (Ta) or tantalum nitride (TaN).

28. The method according to claim 23, wherein the method comprises chemically treating the exposed substrate surface comprising copper or the copper alloy layer to remove a portion of the substrate surface of the copper or copper alloy or to remove corrosion stains from the copper or copper alloy substrate surface.

29. The method according to claim 28, wherein the method comprises chemically removing up to about 50 Å from the exposed substrate surface comprising copper or the copper alloy.

30. The method according to claim 23, further comprising treating the substrate surface with the corrosion inhibitor solution prior to applying the composition.

31. The method according to claim 23, wherein the composition comprises deionized water, citric acid and ammonium hydroxide.

32. The method according to claim 23, wherein the method comprises:
   mounting the substrate on a carrier in a CMP apparatus;
   CMP the substrate using a polishing pad;
   performing the treating of the exposed substrate surface by
   applying the composition; and
   applying the corrosion inhibitor solution while separating the substrate from the polishing pad.

33. The method according to claim 30, wherein the corrosion inhibitor solution comprises between about 0.01 wt. % and about 0.50 wt. % corrosion inhibitor and deionized water.

34. The method according to claim 33, wherein the corrosion inhibitor is selected from the group consisting of benzotriazole, 5-methyl-1-benzotriazole, and combinations thereof.

35. The method according to claim 23, wherein the one or more chelating agents comprising an acid and a base has an acid concentration of up to about 40 wt. % of the composition.

36. The method according to claim 35, wherein the acid is a carboxylic acid having one or more acid groups.

37. The method according to claim 36, wherein the acid is selected from the group consisting of acetic acid, citric acid, maleic acid, and combinations thereof.

38. The method according to claim 23, wherein the base comprises up to about 5 wt. % of the composition.

39. The method according to claim 38, wherein the base comprises between about 0.5 wt. % and about 3 wt. % of the composition.

40. The method according to claim 38, wherein the base is selected from the group consisting of ammonium hydroxide, ammonium hydroxide derivatives, amines, and combinations thereof.

41. The method according to claim 23, wherein the composition further comprises a corrosion inhibitor.

42. The method according to claim 41, wherein the corrosion inhibitor in the composition comprises about 0.01 wt. % and about 0.50 wt. % of the composition.

43. The method according to claim 41, wherein the corrosion inhibitor in the composition is selected from the group consisting of benzotriazole, 5-methyl-1-benzotriazole, and combinations thereof.

44. The method according to claim 23, wherein the composition has a pH between about 4 and about 5 and comprises between about 5 wt. % and about 30 wt. % citric acid, and between about 0.5 and about 3.0 wt. % ammonium hydroxide.

45. The method according to claim 30, wherein the treating the substrate surface with the corrosion inhibitor solution lasts about 3 and about 10 seconds.

46. The method according to claim 23, wherein the composition is applied between about 10 and about 20 seconds.

47. The method according to claim 30, wherein the corrosion inhibitor solution comprises between about 0.01 wt. % and about 0.50 wt. % corrosion inhibitor and deionized water.

48. The method according to claim 30, wherein the corrosion inhibitor is selected from the group consisting of benzotriazole, 5-methyl-1-benzotriazole, and combinations thereof.

49. The method according to claim 23, wherein the corrosion inhibitor solution is applied between about 3 and about 10 seconds.

50. The method according to claim 23, wherein the pH adjusting agent is selected from the group consisting of a nonoxidizing inorganic acid, a nonoxidizing organic acid, a nonoxidizing inorganic base, a nonoxidizing organic base, and combinations thereof.

51. The method according to claim 23, wherein the one or more pH adjusting agents comprise an acidic chelating agent, a basic chelating agent or a combination thereof.

52. A method of planarizing a substrate surface containing a diaelectric layer having an upper surface and at least one opening, a barrier layer lining the opening and the upper surface of the dielectric layer, and copper or a copper alloy filling the opening on the dielectric layer, the method comprising:

removing the copper or copper alloy layer and the barrier leaving an exposed substrate surface comprising copper or copper alloy in the opening; and treating the exposed substrate surface comprising copper or the copper alloy by applying thereto a composition comprising one or more chelating agents, one or more pH adjusting agents to produce a pH between about 3 and about 11, a reducing agent, and deionized water, wherein the one or more chelating agents comprise an acid and a base and wherein the reducing agent is selected from the group consisting of hydroxylamine, glucose, sulfothionate, potassium iodide, and combinations thereof; and then applying a corrosion inhibitor solution.

53. A method of treating a substrate surface comprising copper or a copper alloy, the method comprising:

applying to the substrate surface a composition comprising:
one or more chelating agents, wherein the one or more chelating agents comprise an acid and a base;
one or more pH adjusting agents to produce a pH between about 3 and about 11 ; and
deionized water; and then applying a corrosion inhibitor solution, wherein the composition comprises about 26 wt. % citric acid, about 3 wt. % ammonia, deionized water, and a pH of about 4.

54. A method of planarizing a substrate surface containing an dielectric layer having an upper surface and at least one opening, a barrier layer lining the opening and the upper surface of the dielectric layer, and copper or a copper alloy filling the opening and on the dielectric layer, the method comprising:

removing the copper or copper alloy layer and the barrier leaving an exposed substrate surface comprising copper or copper alloy in the opening; and treating the exposed substrate surface comprising one or more chelating agents, one or more pH adjusting agents to produce a pH between about 3 and about 11, and deionized water, wherein the one or more chelating agents comprise an acid and a base; and then applying a corrosion inhibitor solution, wherein the composition comprises about 26 wt.% citric acid, about 3 wt.% ammonia, deionized water, and a pH of about 4.

* * * * *

UNITED STATES PATENT AND TRADEMARK OFFICE
CERTIFICATE OF CORRECTION

PATENT NO. : 7,104,267 B2 Page 1 of 1
APPLICATION NO. : 09/727133
DATED : September 12, 2006
INVENTOR(S) : Emami et al.

It is certified that error appears in the above-identified patent and that said Letters Patent is hereby corrected as shown below:

Column 1, Line 47: Change "an" to --a--

Column 6, Line 52: Change "boron-and" to --boron- and--

Column 9, Claim 23, Line 39: Change "an" to --a--

Column 10, Claim 42, Line 66: After "comprises", insert --between--

Column 11, Claim 45, Line 12: After "lasts", insert --between--

Column 11, Claim 52, Line 36: Change "diaelectric" to --dielectric--

Column 12, Claim 54, Line 26: Change "an" to --a--

Column 12, Claim 54, Line 34: After "comprising", insert --copper or the copper alloy by applying thereto a composition comprising--

Signed and Sealed this

Thirteenth Day of February, 2007

JON W. DUDAS
*Director of the United States Patent and Trademark Office*